(12) United States Patent
Koizumi et al.

(10) Patent No.: US 6,973,720 B2
(45) Date of Patent: Dec. 13, 2005

(54) METHOD FOR MANUFACTURING A CONNECTOR INTEGRATED WITH A LED

(75) Inventors: Masakazu Koizumi, Nishikamo-gun (JP); Shingo Mizuguchi, Nishikamo-gun (JP); Tatsuji Hirano, Nishikamo-gun (JP); Koichi Fukasawa, Fujiyoshida (JP); Hirohiko Ishii, Fujiyoshida (JP); Junji Miyashita, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 10/875,431

(22) Filed: Jun. 24, 2004

(65) Prior Publication Data
US 2004/0232508 A1 Nov. 25, 2004

Related U.S. Application Data

(62) Division of application No. 10/409,279, filed on Apr. 8, 2003.

(30) Foreign Application Priority Data
Apr. 19, 2002 (JP) ........................................ 2002-118415

(51) Int. Cl.[7] .............................................. H01R 43/00
(52) U.S. Cl. ........................................ 29/856; 257/746
(58) Field of Search ...................... 29/877, 883, 856; 438/26, 610; 257/746; 264/438, 439, 108, 451, 437; 439/91

(56) References Cited

U.S. PATENT DOCUMENTS

| | | | |
|---|---|---|---|
| 3,991,463 A | 11/1976 | Squitieri | |
| 4,204,205 A | 5/1980 | Yagi et al. | |
| 4,209,481 A | 6/1980 | Kashiro et al. | |
| 4,449,774 A | 5/1984 | Takashi et al. | |
| 4,737,112 A | * | 4/1988 | Jin et al. ........................ 439/66 |
| 5,265,329 A | 11/1993 | Jones et al. | |
| 5,635,846 A | 6/1997 | Beaman et al. | |
| 6,011,307 A | * | 1/2000 | Jiang et al. .................. 257/746 |
| 6,078,500 A | 6/2000 | Beaman et al. | |
| 6,149,857 A | * | 11/2000 | McArdle et al. ............. 264/429 |
| 6,190,509 B1 | * | 2/2001 | Haba ............................ 204/164 |
| 6,281,435 B1 | 8/2001 | Maekawa | |
| 6,509,634 B1 | 1/2003 | Lee et al. | |

FOREIGN PATENT DOCUMENTS

JP 55-111014 8/1980

\* cited by examiner

Primary Examiner—Neil Abrams
(74) Attorney, Agent, or Firm—Hamre, Schumann, Mueller & Larson, P.C.

(57) ABSTRACT

Method for manufacturing an elastic connector, integrated with an electrode of at least either a chip-type LED or a printed circuit board on which a LED element is directly mounted and to which the LED is electrically connected. The LED-integrated connector can subsequently be mounted on another circuit board by being sandwiched and compressed between a lower surface of the chip-type LED or lower surface of the LED-mounted printed circuit board and the other circuit board to which the LED-integrated connector is being mounted, so as to provide an electric connection. The method providing a LED-integrated connector which is thin and cost-effective while able to provide a simple and secure conductivity between electrodes of the chip-type LED and other circuit board, to which the LED-integrated connector is subsequently mounted.

7 Claims, 7 Drawing Sheets

METHOD FOR MANUFACTURING A CONNECTOR INTEGRATED WITH A LED

This application is a divisional of application Ser. No. 00/409,279, filed Apr. 8, 2004, which application(s) are incorporated herein by reference.

FIELD OF THE INVENTION

The present invention relates to a connector integrated with a LED element, which provides an electric connection of a chip-type LED and a circuit board, a method for manufacturing the same connector, and a LED including the same connector.

BACKGROUND OF THE INVENTION

Conventionally known methods for an electric connection of a chip-type light emitting diode (LED) and a circuit board are soldering, lead connection, and an electric connection by means of an anisotropic conductive elastic connector. This anisotropic conductive elastic connector is used widely for a small chip-type LED that is difficult to connect electrically by means of soldering or leads. In the recent demands for thin electronic equipment, connections for allowing a decrease in spacing between a chip-type LED and a circuit board are required. And thus, needs for such anisotropic conductive connectors and anisotropic conductive films (ACF) are increased.

However, for decreasing the spacing between the chip-type LED and the circuit board by use of such an anisotropic conductive elastic connector, it is desirable in general that the connector is thin, or the connector is small in the height direction or its energization direction. Though an anisotropic conductive elastic connector satisfying such conditions is as thin as about 0.5 mm, such a connector is difficult to handle, and operations for mounting the connector on an electrode will be quite difficult.

When the thickness of the anisotropic conductive elastic connector is set to be 0.2 mm or less for decreasing the spacing between the chip-type LED and the circuit board to be less than 0.5 mm, the strength of the connector will deteriorate considerably, so that it will be cracked easily when pinched with tweezers or parts-feeders.

Even though the elastic connector serves to decrease the spacing between the chip-type LED and the circuit board, the use of the connector necessarily will increase the number of the components or members in comparison with conventional technique using solder. This is not desirable in view of recent electronic equipment designed for decreasing the numbers of the components.

The chip-type LED and the circuit board will be deformed easily due to impact resilience caused by the sandwiching when an elastic connector is inserted and sandwiched between a chip-type LED and a circuit board for an electric connection of the electrodes, because both the LED and the circuit board are thin and light-weight. As a result, surfaces of the elastic connector in contact with the circuit board can be applied with uniform pressure. In this case, the contact between the conductor of the elastic connector and the electric circuit of the chip-type LED will be insufficient. At worst, the electric circuit may lose its operability.

Thermocompression bonding by use of ACF enables automation in mounting on a circuit board, and thus it allows setting of the spacing between the chip-type LED and a circuit board to be at most several tens of $\mu$m. However, a facility for applying heat and pressure will be indispensable. Moreover, heat and pressure should be applied uniformly on the entire surfaces to be bonded so as to provide secure conductivity and adhesion. For such reasons, the method is suitable for mounting an electrode with a flat surface, e.g., connection of an electrode terminal on a liquid crystal panel and a flexible printed circuit (FPC) board. However, it is difficult to apply heat and pressure uniformly on respective chip-type LEDs in the case of printed circuit boards on which various chip-type LEDs are mounted, making mounting difficult.

Moreover, it is considerably difficult to peel the LED after the connection in the cases of soldering and AFCs. For example, when any defect is found in an expensive unit of electronic parts such as a semiconductor and a resistor, the whole unit must be discarded even if many chip-type LEDs in the unit have no fault, since the unit cannot be repaired.

SUMMARY OF THE INVENTION

In order to solve the above-identified problems, the present invention provides a connector that is integrated with a LED element. The connector is thin and serves to simplify a connection between an electric circuit of a chip-type LED and a printed circuit board so as to improve the yield, lower the production cost, and secure an electric connection to an electrode. The present invention provides also a method for manufacturing the same, and a LED including the connector.

For achieving the object, a connector according to the present invention is an elastic connector for electrically connecting an electrode of a chip-type LED and that of a circuit board facing each other. For this object, the connector is sandwiched between the electrodes and compressed. The elastic connector is arranged on an electrode on at least either the chip-type LED or the circuit board.

A method for manufacturing an integrated connector according to the present invention includes: mixing magnetic staple fibers with a liquid polymer; arranging the liquid polymer between a nonmagnetic film and an electrode on either a chip-type LED or a circuit board; orienting and localizing the magnetic staple fibers in the liquid polymer by the action of a magnetic field, and; crosslinking the liquid polymer so that the magnetic staple fibers integrate with the electrode on the chip-type LED.

Next, a LED according to the present invention is manufactured by arranging an elastic connector on an electrode formed on at least either the chip-type LED or the circuit board; arranging the elastic connector to be sandwiched between the electrode of the electric circuit of the chip-type LED and the circuit board facing each other; and compressing the elastic connector for an electric connection of the electrodes.

DETAILED DESCRIPTION OF THE INVENTION

Figure 1:
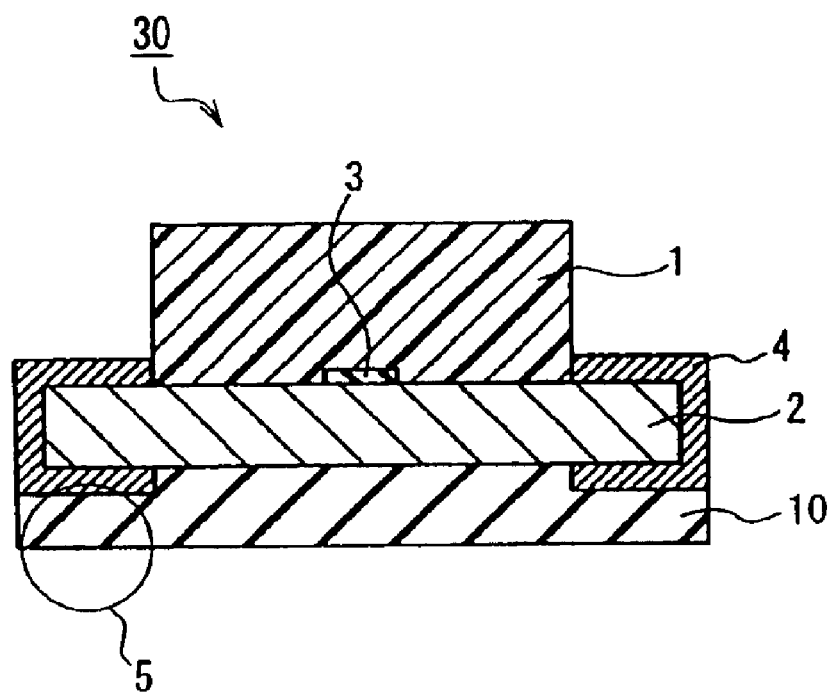
FIG. 1 is a vertical cross-sectional view showing a connector that is integrated with a LED chip-type substrate in one embodiment of the present invention.

It is preferable that an elastic connector according to the present invention is insulating and it contains magnetic staple fibers functioning as conductors. The magnetic staple fibers are oriented respectively in the thickness direction of the elastic connector, and one end of each magnetic staple fiber is in contact with either an electrode of a chip-type LED or an electrode of a circuit board, while the other end thereof is exposed or protruded from an surface of the elastic connector.

The magnetic staple fibers are arranged corresponding to the position of the electrode on the chip-type LED or the electrode of the circuit board, and the number of the magnetic staple fibers can be controlled suitably corresponding to the required current capacity.

It is preferable that the material of the elastic connector is a silicone rubber formed by crosslinking a liquid polymer. Furthermore, it is preferable that the material of the elastic connector is a silicone rubber having a durometer hardness ranging from 30 ShoreA to 80 ShoreA according to ASTM D2240, or more preferably, from 45 ShoreA to 65 ShoreA.

Though there is no specific limitation, it is preferable that the thickness of the elastic connector is not more than 2 mm, or more preferably, not more than 1 mm for preventing buckling of the magnetic staple fibers.

It is preferable that each of the magnetic staple fibers is shaped cylindrically to have a diameter of not more than 0.05 mm, or more preferably, not more than 0.02 mm. Examples of suitable materials for the magnetic staple fibers include iron, nickel, and stainless steel. It is preferable that the surfaces of the magnetic staple fibers are plated with solder, tin, silver, gold, platinum or the like for the purpose of preservation and stabilization of its energization. Here, the term of 'staple' denotes a fine and short fiber made of metal, and 'magnetic' denotes a property that the staple is attracted by a magnetic force of about 0.3 T.

Though there is no specific limitation, it is preferable that the magnetic staple fibers protrude from the elastic connector by a range of 0.003 mm to 0.050 mm, and more preferably, by a range of 0.005 mm to 0.015 mm, thereby obtaining a desirable contact conductivity.

In a manufacturing method according to the present invention, a plurality of magnetic staple fibers having a substantially equal length is mixed and dispersed in a matrix solution (a liquid polymer). The thus obtained solution is applied onto a nonmagnetic film covered with an inactive soft coating film, where the thickness of the applied solution was not less than the length of the magnetic staple fibers. Next, an electronic member that has been masked (32) except for its electrode is bonded to the film. This is inserted into a space between a pair of molds having surfaces with parts for localizing magnetic force. The magnetic staple fibers are oriented in the thickness direction of the films and localized. Maintaining the orientation, the opposed surfaces of the molds are brought to be close so that one end of each magnetic staple fiber pierces the soft coating film. Later, the matrix solution is cured and solidified by crosslinking, and the films and the mask (32) are removed.

The thus obtained elastic connector is bonded to the electronic member on one surface and a number of magnetic staple fibers are oriented in the thickness direction of the elastic connector. Each of the magnetic staple fibers is in contact with an electrode of the electronic member at one end, while the other end protrudes from the surface of the elastic connector.

The magnetic staple fibers can be localized on an electrode of the electronic member by aligning the electrode with a certain portion between the molds for localizing the magnetic force lines. The number of the magnetic staple fibers can be determined corresponding to a rated value in a use of the electronic member, by controlling the mixing ratio of the magnetic staple fibers to the matrix solution.

Ingredients of the matrix solution will not be limited specifically, as long as the solution has a sufficient melt-liquidity for dispersing the magnetic staple fibers at or below the Curie point of the magnetic material at any of the stages as a polymer, a prepolymer or a monomer, thereby forming an elastic material as a result of polymerization or solidification.

The present invention relates to an elastic connector that is sandwiched and compressed by an electrode of a chip-type LED and that of a circuit board so as to electrically connect the chip-type LED and the circuit board. By arranging the connector on an electrode of at least either the chip-type LED and the circuit board, the LED and the connector can be integrated to compose one component.

Even when the thickness of the elastic connector is determined to be less than 0.2 mm for decreasing the spacing between the chip-type LED and the circuit board, the elastic connector can be prevented from being cracked. Thus, the mounting operations can be performed stably in a simple manner.

The elastic connector is made of an insulating elastic material in which magnetic staple fibers functioning as conductors are oriented respectively in the thickness direction. In the crosslinked and integrated elastic connector, one end of each of the magnetic staple fibers is in contact with an electrode of either the chip-type LED or the circuit board, while the other end is exposed or protruded from the surface of the elastic connector. Thereby, a stable contact resistance can be obtained during energization.

Furthermore, the magnetic staple fibers oriented in the thickness direction of the elastic connector can be formed corresponding to the position of an electrode on the chip-type LED, and the number of the magnetic staple fibers can be determined corresponding to the required current capacity. Thereby, the efficiency is improved and the contact can be secured.

The chip-type LED may be, for example, those from Citizen Electronics Co., Ltd. with trade names "CL-150" series and "CL-190" series (both of which are surface-mounting type).

Specific embodiments are described below.

A connector according to the present invention is an elastic connector welded by pressure between an electrode of a chip-type LED and that of a circuit board facing each other so as to provide an electric connection, where the connector is formed by arranging a liquid polymer on an electrode surface on at least either the chip-type LED or the circuit board, and crosslinking the liquid polymer. Magnetic staple fibers functioning as conductors are oriented respectively in the thickness direction of the connector. One end of each of the magnetic staple fibers is in contact with an electrode of the chip-type LED or that of the circuit board, while the other end is exposed or protruded from the surface of the elastic connector.

Embodiments of the present invention will be described below in reference to the attached drawings.

Figure 2:
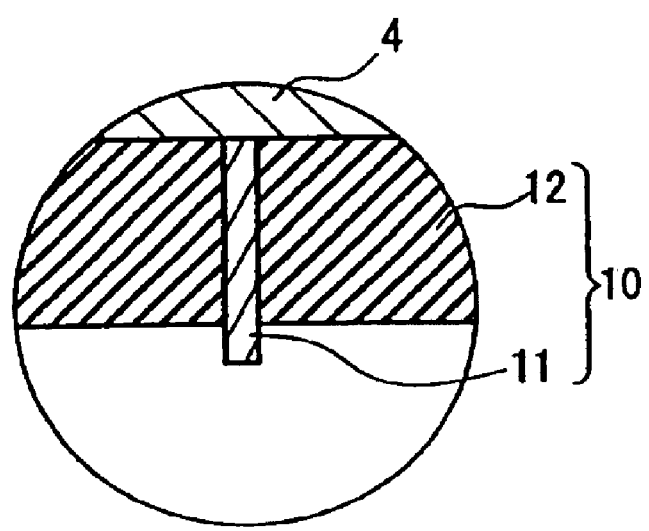
FIG. 2 is an enlarged view showing a part of the connector in FIG. 1, for clarifying a magnetic staple fiber.
Figure 3A:
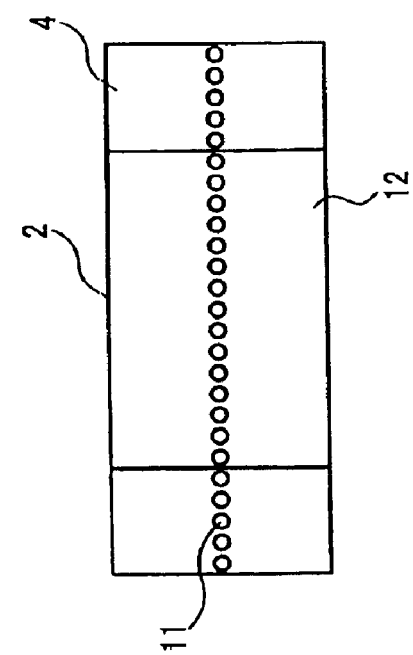
FIGS. 3A–3D shows examples of magnetic staple fibers as conductors arrayed in the connectors integrated with LED substrates in one embodiment of the present invention.
Figure 3B:
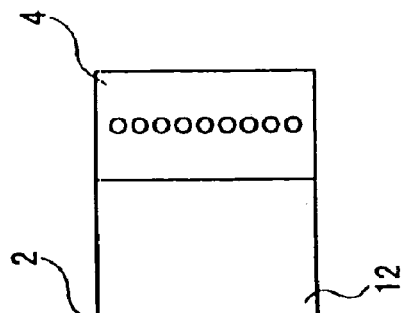
Figure 3C:
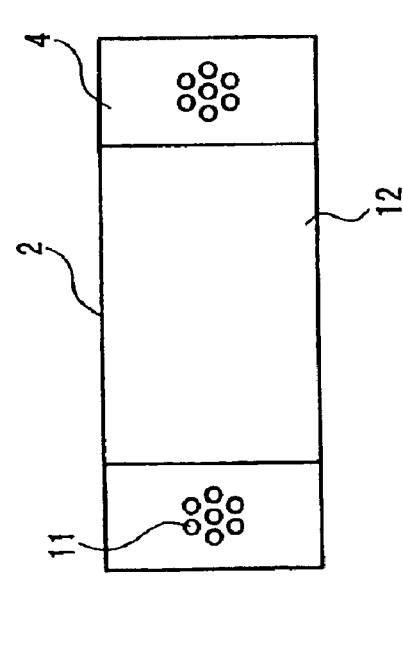
Figure 3D:
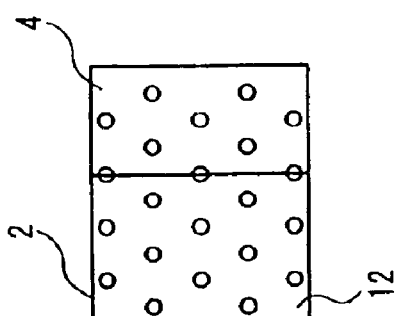
Figure 12:
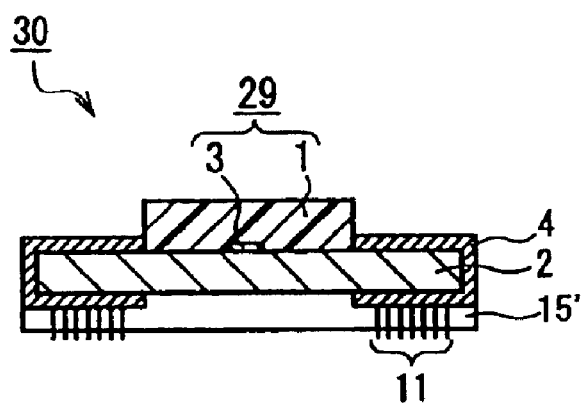
FIG. 12 is a cross-sectional view showing a connector according to the present invention, including an elastic connector of a silicone rubber integrated with a small chip-type LED obtained in Example 2. The elastic connector contains gold-plated stainless steel fibers, and an end of each fiber is in contact with an electrode of the small chip-type LED while the other end protrudes from a surface of the elastic connector of a silicone rubber.

FIG. 1 is a vertical cross-sectional view of a connector 10 arranged on a back surface of a LED chip-type substrate. FIG. 2 is an enlarged view showing an area indicated with numeral 5 for clarifying the orientation of a magnetic staple fiber 11 functioning as a conductor. Actually, a plurality of magnetic staple fibers 11 are oriented as shown in FIG. 12.

FIGS. 3A–3D show examples of arrays of magnetic staple fibers 11 in connectors, each of which is integrally formed on the back surfaces of the LED substrates.

In FIGS. 1–3, numeral 3 denotes a LED element, 1 denotes a resin that seals the LED element 3, 2 denotes a PCB integrated with the LED element 3 and the resin 1, 4 denotes an electrode terminal, and 10 denotes an elastic connector. Numeral 11 denotes a magnetic staple fiber functioning as a conductor that is electrically connected with the electrode terminal 4, 12 denotes an elastic insulator, and 30 denotes a LED including the connector 10 integrated with other electronic members.

As shown in FIG. 2, one end of the magnetic staple fiber 11 protrudes from the surface of the elastic insulator 12. The magnetic staple fiber 11 and the electrode terminal 4 on the PCB 2 are connected electrically to each other.

Figure 4:
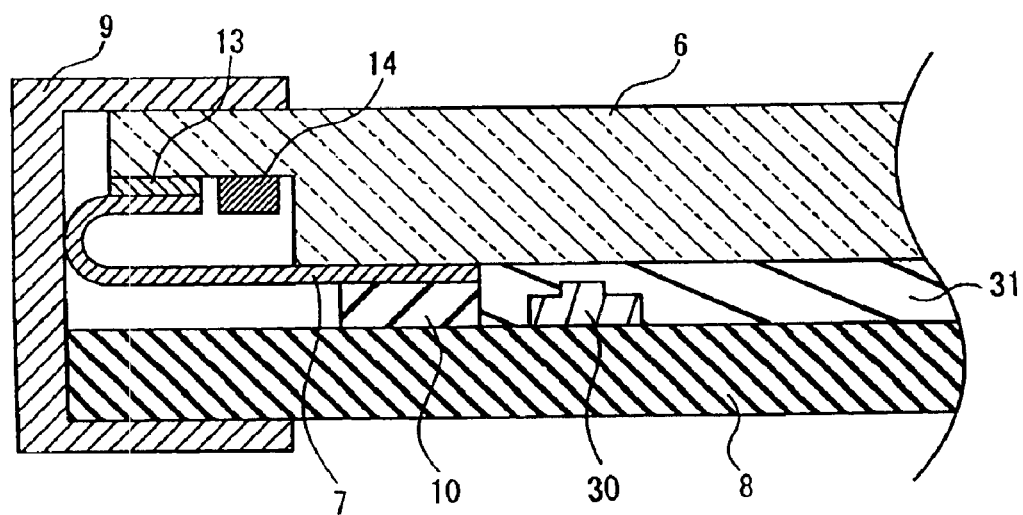
FIG. 4 is a vertical cross-sectional view showing an example of a connector that is integrated with a tip of a FPC board in one embodiment of the present invention, where the FPC board is connected to an electrode terminal of a liquid crystal panel by means of an ACF.

FIG. 4 is a vertical cross-sectional view showing an example of a connector integrated onto a tip of a FPC board, in which the FPC board is connected to an electrode terminal of a liquid crystal panel by means of an ACF.

In FIG. 4, numeral 7 denotes a FPC board, 10 denotes an elastic connector that is integrally laminated on the FPC board, 6 denotes a liquid crystal panel, 8 denotes a PCB, 9 denotes a fixture for holding the liquid crystal panel and the PCB 8, 13 denotes an ACF, and 14 denotes a liquid crystal driving integrated circuit.

In this embodiment, the connector 10 is compressed and held in a predetermined space between the liquid crystal panel 6 and the PCB 8 by means of the fixture 9, to establish an electric connection between the FPC board 7 and the PCB 8. The LED 30 is mounted on the PCB 8 and it faces the back surface of the liquid crystal panel 6. Light emitted from the LED 30 is diffused uniformly as a backlight through a light-conducting plate 31 onto the back surface of the liquid crystal panel 6.

The following description concerns an example of a method for manufacturing an elastic connector to be integrated with a printed board.

Figure 5:
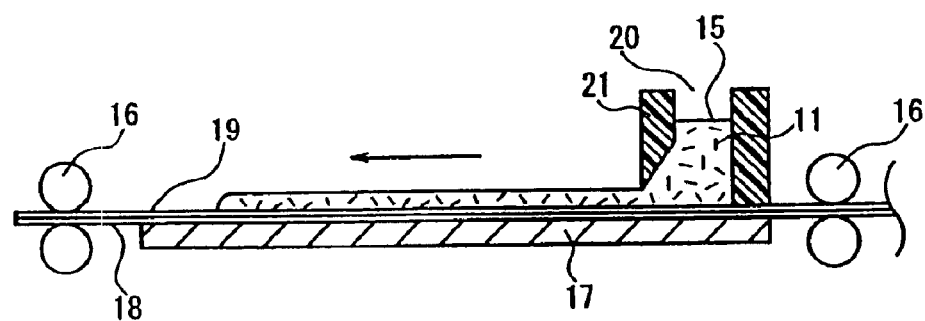
FIG. 5 is a schematic cross-sectional view showing a device for applying uniformly a liquid polymer mixed with magnetic staple fibers, the device is used in a step of manufacturing in one embodiment of the present invention.

FIG. 5 is a cross-sectional view of a device for coating uniformly a liquid polymer 15 containing the magnetic staple fibers 11 on a nonmagnetic film 18 that is previously coated with an inactive soft coating film 19. Numeral 16 denotes feeding rollers, 17 denotes a table, and 21 denotes a film-thickness controlling plate. The inactive soft coating film 19, which is made of an acrylic resin or the like, is coated to have a thickness that is substantially equal to the length of a magnetic staple fiber 11. Specifically, the liquid polymer 15 containing mixed and dispersed magnetic staple fibers 11 is poured from a supply port 20 so as to form a coating film having a predetermined thickness.

The liquid polymer 15 is coated to have a thickness greater by 0.05 mm than the length of the magnetic staple fibers 11.

Figures 6, 7:
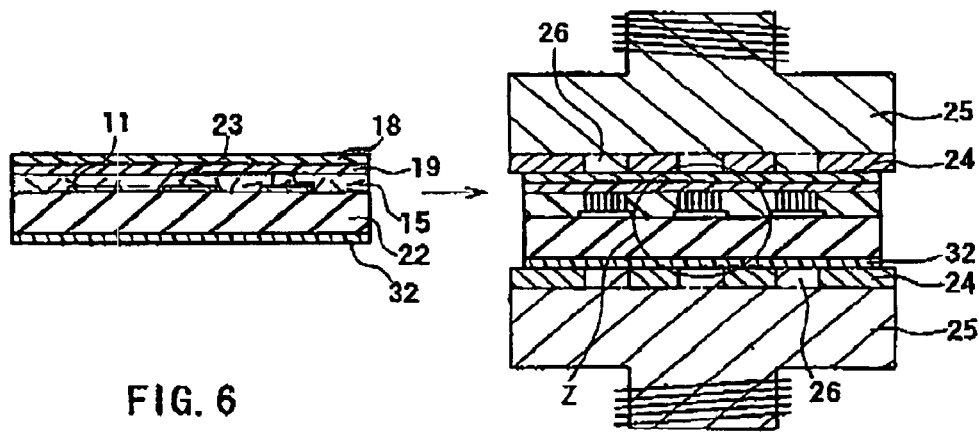
FIG. 6 is a cross-sectional view showing a process of manufacturing in one embodiment of the present invention, where a film applied with a liquid polymer containing magnetic staple fibers and a printed circuit board are integrated to each other.
FIG. 7 is a cross-sectional view showing a printed circuit board with films sandwiched in a pair of electromagnetic molds in a manufacturing process according to an embodiment of the present invention.

Subsequently, the nonmagnetic film 18 and the inactive soft coating film 19 are bonded to the surface of the printed board 22 with the electrode 23 as shown in FIG. 6, with care taken not to form bubbles in the interface.

For improving adhesion between the printed board and the liquid polymer, a silane coupling agent, a titanium coupling agent or the like can be applied previously onto the printed circuit board.

Next, as shown in FIG. 7, the printed board 22 provided with the liquid polymer 15 and the films 18, 19 is inserted into a space between a pair of electromagnetic molds 25, each of which is composed of a nonmagnetic portion 24 and magnetic poles 26 for localizing magnetic force. At that time, an electrode on the printed board 22 is positioned between facing magnetic poles 26. When the electromagnetic molds 25 are subjected to a magnetic field, lines of magnetic field are generated between the facing magnetic poles 26, and thus the magnetic staple fibers 11 are oriented and arrayed in the liquid polymer 15.

Figure 8:
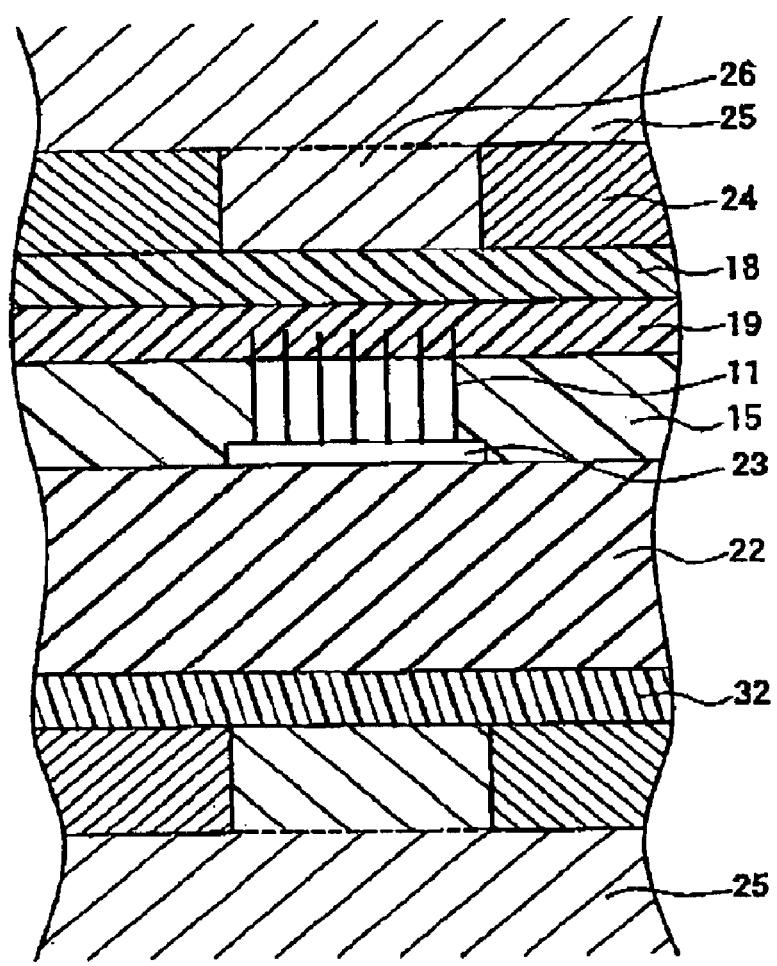
FIG. 8 is an enlarged cross-sectional view of a part indicated as Z in FIG. 7, showing the orientation and array of the magnetic staple fibers piercing partially an inactive soft coating film.

FIG. 8 is an enlarged view of a part indicated as 'Z' in FIG. 7. After the magnetic staple fibers 11 are oriented and arrayed, the space between the electromagnetic molds 25 are narrowed such that one end of each magnetic staple fiber pierces the inactive soft coating film 19. Subsequently, the liquid polymer is solidified by curing or crosslinking to form an elastic layer 15'.

Figure 9:
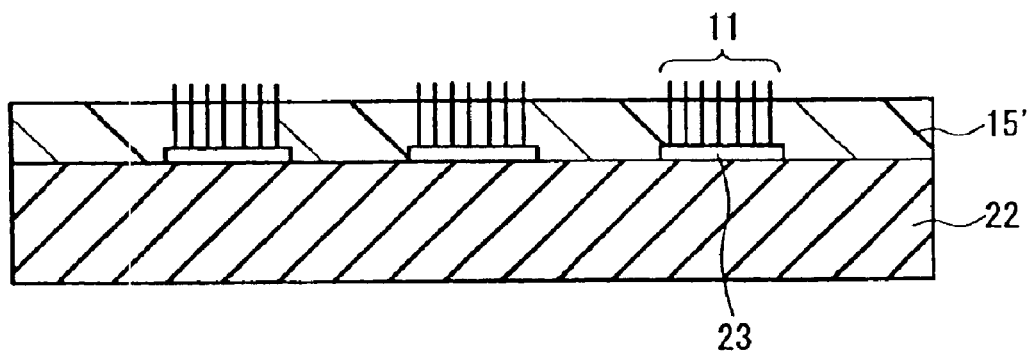
FIG. 9 is a cross-sectional view showing an integrated laminated product of a printed board and an elastic connector obtained according to one embodiment of the present invention, where the elastic connector is formed by crosslinking and solidifying a liquid polymer containing magnetic staple fibers functioning as conductors, and each of the magnetic staple fibers is oriented respectively in the thickness direction of the laminated product and in contact with an electrode of the printed board at one end while the other end thereof protrudes from the elastic connector.

Next, the printed board 22 is taken out from the space in the electromagnetic molds 25 and the films 18, 19 are removed so as to obtain a laminate including the elastic layer 15'. As shown in FIG. 9, the elastic layer 15' is integrated with the printed board 22, and the magnetic staple fibers 11 are oriented respectively in the thickness direction to pierce the elastic layer 15' so that one end of each of the magnetic staple fibers 11 is in contact with an electrode 23 on the printed board 22 while the other end protrudes from the surface of the elastic layer 15'.

An elastic connector according to the present invention is provided for an electric connection between an electrode of a chip-type LED circuit and that of a circuit board facing each other, and the electric connection is obtained by sandwiching and compressing the connector with the facing electrodes. As the connector is integrated with a surface having an electrode of at least either the chip-type LED or the circuit board, the chip-type LED and the connector, which have been regarded as separate and independent components, can be integrated to form one component.

The integration is useful also for preventing cracks of the elastic connector even when the thickness of the elastic connector is determined to be less than 0.2 mm for decreasing the spacing between the chip-type LED and the circuit board. Therefore, operations for the mounting can be performed stably in a simple manner.

The elastic connector is made of an insulating elastic material in which magnetic staple fibers as conductors are oriented respectively in the thickness direction. One end of each of the magnetic staple fibers is in contact with either an electrode of the chip-type LED or an electrode of the circuit board, while other end is exposed or protruded from the surface of the elastic connector, thereby obtaining a stable contact resistance during energization.

Furthermore, the magnetic staple fibers oriented in the thickness direction of the elastic connector can be arranged corresponding to the position of the electrode of the chip-type LED, and the number of the magnetic staple fibers can be determined arbitrarily corresponding to the required current capacity, thereby realizing an efficient and secure contact.

EXAMPLES

The present invention will be described further in reference to the following Examples.

Example 1

A ferrite-type stainless steel fiber with a diameter of 0.012 mm was stretched and wholly dipped in a molten nylon resin. Then, the fiber was cooled and cut to obtain staple fibers having an average length of 0.2 mm. After melting and removing the nylon resin, the staple fibers were subjected to electroless plating with nickel and gold so as to obtain magnetic staple fibers. Subsequently, the staple fibers were added in an amount of 7 wt % to an undiluted solution of a thermosetting silicone rubber having a viscosity of 10 Pa·S, mixed, and defoamed. Meanwhile, a polyester film having a thickness of 0.05 mm was prepared and coated with a soft coating film having a thickness of 0.03 mm of an acrylic emulsion supplied by Nippon Carbide Industries Co., Inc. with a trade name of "NIKAZOL". The above-mentioned solution containing the magnetic staple fibers was coated on the polyester film via the soft coating film so as to have a thickness of 0.4 mm, by using a desktop coater.

A comb-like circuit used in this example is 0.018 mm in thickness, 1 mm in pitch, and 0.5 mm in circuit width. The comb-like circuit is formed on an upper surface of a polyimide film having a thickness of 0.1 mm, and it is coated with a copper foil and plated with gold. This circuit was treated with a 1 wt % silane coupling agent and air-dried. The surface of the board with the comb-like circuit was bonded to the coated surface of the polyester film.

Planar molds that serve as magnetic poles were prepared, and the comb-like circuit board provided with the solution and the polyester film was inserted into the space of the molds. At that time, the electrodes of the comb-like circuit were positioned in the space between facing magnetic poles on the molds.

The space between the two facing molds was set to be 0.6 mm. Between the magnetic poles of the respective molds, magnetic flux density of 0.3 T was generated so as to orient and array the magnetic staple fibers of stainless steel on the electrode positioned between the facing magnetic poles.

Next, the surface temperature of the molds was raised to 60° C., and the space between the molds was narrowed to 0.38 mm.

After one hour, the molds were disassembled to obtain a silicone rubber sheet (elastic insulator) sandwiched between the board and the polyester film. The thus obtained connector is integrated with a comb-like circuit board, and each of the magnetic staple fibers was contacted at one end with an electrode on the board, while the other end protrudes by 0.018 mm from a surface of the silicone rubber sheet.

Example 2

A ferrite type stainless steel fiber having a diameter of 0.012 mm was stretched and wholly dipped in a molten nylon resin. Then, the fiber was cooled and cut to obtain staple fibers having an average length of 0.2 mm. After melting and removing the nylon resin, the staple fibers were subjected to electroless plating with nickel and gold so as to provide magnetic staple fibers. The magnetic staple fibers were added in an amount of 7 wt % to an undiluted solution of a thermosetting silicone rubber having a viscosity of 10 Pa·S, and mixed. After defoaming, the mixed solution was coated to be 0.25 mm in thickness on a polyester film prepared in the same manner as in Example 1.

Figure 10:
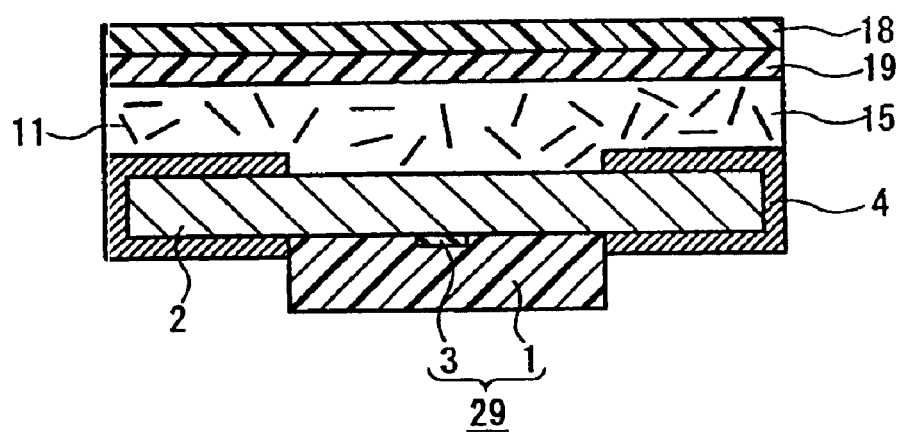
FIG. 10 is a schematic cross-sectional view showing a laminated product in a manufacturing process in Example 2 of the present invention.

As shown in FIG. 10, the silicone rubber sheet was bonded so as to face the backside of a LED element 3 of a surface mounted small chip-type LED 29 supplied under a trade name of "CL-150" by Citizen Electronics Co., Ltd.

Figure 11:
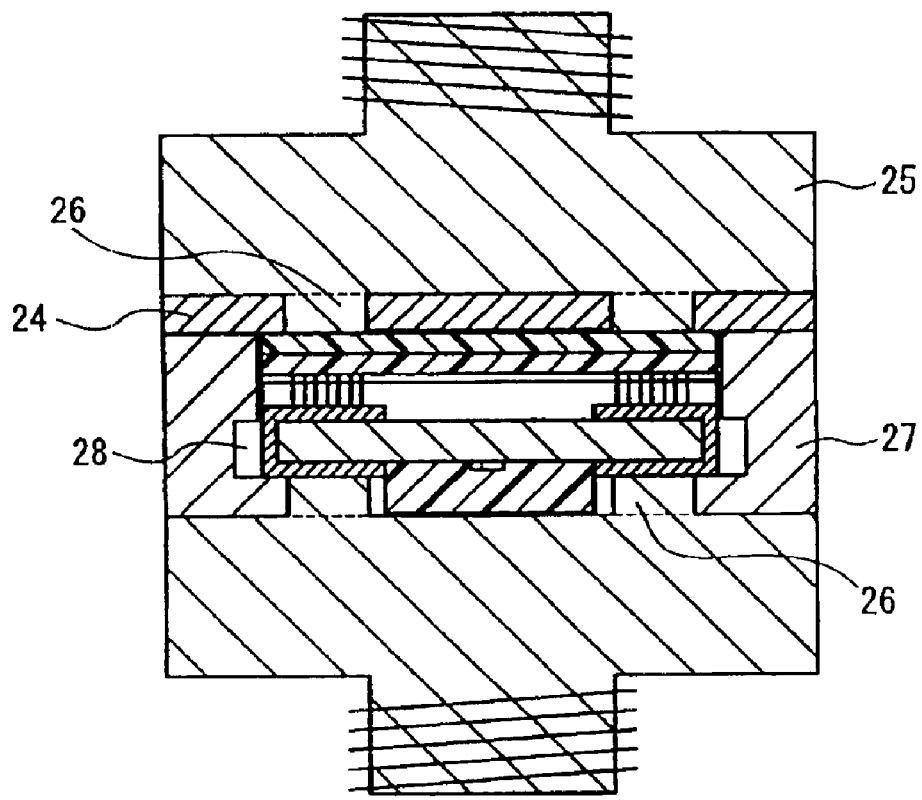
FIG. 11 is a schematic cross-sectional view showing a device for manufacturing an LED in Example 2 of the present invention.

Next, as shown in FIG. 11, the sheet with the small chip-type LED 29 was inserted into a space between a pair of electromagnetic molds 25 composed of nonmagnetic portions 24, 27 and magnetic poles 26 for localizing magnetic force. At this time, the magnetic poles 26 of the upper and lower molds were positioned to sandwich the electrode 4 of the small chip-type LED.

The space between the upper and lower molds was set to be 1.45 mm, and a magnetic flux density of 0.3 T was generated between the magnetic poles. Thereby, the magnetic staple fibers contained in the liquid polymer were oriented and arrayed on the electrode positioned between the pairs of magnetic poles of the molds.

Next, the surface temperature of the molds was raised to 60° C., and the space between the molds was narrowed to 1.36 mm. As a result, excess silicone rubber solution was stored in concavities 28 formed in the molds.

After one hour, the molds were disassembled to obtain a silicone rubber sheet with the small chip-type LED and the polyester film, from which the polyester film and the excess silicon rubber were removed. The thus obtained LED 30, as shown in FIG. 12, contained magnetic staple fibers, each of which was in contact with an electrode of the small chip-type LED at one end while the other end protruded from the silicone rubber sheet by 0.015 mm.

The invention may be embodied in other forms without departing from the spirit or essential characteristics thereof.

The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A method for manufacturing an LED-integrated connector, the LED-integrated connector comprising an elastic connector to be sandwiched and compressed between opposed electrodes of a printed circuit board on which an electric circuit of a chip-type LED is mounted and another circuit board so as to provide an electric connection between the electrodes of the chip-type LED and the other circuit board through the LED-integrated connector, wherein a LED element of the chip-type LED is sealed with resin and mounted on a printed circuit board, and an electrode terminal provided on the printed circuit board extends below the printed circuit board, and the elastic connector is laminated under the printed circuit board below which the electrode terminal extends, the method comprising:

(a) providing a liquid polymer containing magnetic staple fibers in a space between a nonmagnetic film and either an electrode on a chip-type LED or an electrode on the printed circuit board, so as to form the elastic connector therebetween;

(b) orienting and localizing the magnetic staple fibers in the liquid polymer, included in the elastic connector, with a magnetic field;

(c) crosslinking the liquid polymer so that the magnetic staple fibers integrate with the electrodes of the printed circuit board on which the chip-type LED is directly mounted, thereby integrating the bottom surface of the LED-mounted printed circuit board and the elastic connector.

2. The method according to claim 1, wherein the liquid polymer is a silicone rubber.

3. The method according to claim 1, wherein the chip-type LED or the printed circuit board is masked except for the surface having an electrode, before pouring the liquid polymer.

4. The method according to claim 1, wherein orienting and localizing the magnetic staple fibers, and integrating the bottom surface of the LED-mounted printed circuit board and the elastic connector further comprises:

inserting the combination provided in step (a) into a spacing between a pair of molds, wherein the molds have surfaces with parts to localize lines of magnetic force, wherein the nonmagnetic film is a resin film coated with an inactive soft coating film, and the magnetic staple fibers are magnetically oriented in the thickness direction of the film; and reducing a space between opposed surfaces of the molds while maintaining the orientation such that one end of each of the magnetic staple fibers pierces the soft coating film.

5. The method according to claim 4, wherein the end of the magnetic staple fiber pierces the soft coating film by a range of 0.003 mm to 0.50 mm.

6. The method according to claim 4, wherein the magnetic staple fibers oriented in the thickness direction of the elastic connector are arranged corresponding to the position of the electrodes of the LED-mounted printed circuit board, and the number of the magnetic staple fibers is controlled to a suitable range corresponding to a required current capacity.

7. The method according to claim 4, further comprising removing the non-magnetic film and the inactive soft coating film subsequent to solidifying the liquid polymer and removing the combination provided in step (a) from the spacing between the pair of molds.

* * * * *